United States Patent [19]

Loersch et al.

[11] Patent Number: 4,514,469
[45] Date of Patent: * Apr. 30, 1985

[54] PEENED OVERLAY COATINGS

[75] Inventors: Joseph F. Loersch, Bolton; James W. Neal, Columbia, both of Conn.

[73] Assignee: United Technologies Corporation, Hartford, Conn.

[*] Notice: The portion of the term of this patent subsequent to Jun. 19, 2001 has been disclaimed.

[21] Appl. No.: 300,727

[22] Filed: Sep. 10, 1981

[51] Int. Cl.³ .............................. B22F 7/04; C21D 7/06
[52] U.S. Cl. ........................................... 428/553; 72/53
[58] Field of Search ................. 428/553, 678; 420/437, 420/445; 75/126 R; 72/53

[56] References Cited

U.S. PATENT DOCUMENTS

| | | | |
|---|---|---|---|
| 3,542,530 | 11/1970 | Talboom | 29/183.5 |
| 3,590,777 | 7/1971 | Elam et al. | 118/7 |
| 3,628,994 | 12/1971 | Blecherman et al. | 117/107.1 |
| 3,639,151 | 2/1972 | Krutenat | 117/93.4 |
| 3,667,421 | 6/1972 | Bala | 118/7 |
| 3,676,085 | 7/1972 | Evans | 29/194 |
| 3,918,139 | 11/1975 | Felten | 29/194 |
| 3,928,026 | 12/1975 | Hecht et al. | 75/134 |
| 4,034,585 | 7/1977 | Straub | 72/53 |
| 4,235,943 | 11/1980 | McComas et al. | 427/34 |
| 4,236,059 | 11/1980 | McComas et al. | 219/121 |

OTHER PUBLICATIONS

Kurz, "Shot Peening", Modern Machine Shop, (Jun. 1967), pp. 4–12; 20–23; 32–35.
Robertson, "The Effects of Shot Size on Residual . . . ", No. 710284, (Sep. 1968), SAE Transactions.
Metal Improvement Corp., "Shot Peening Applications", 6th Ed., (1980), p. 10.

Primary Examiner—Benjamin R. Padgett
Assistant Examiner—Anne Brookes
Attorney, Agent, or Firm—C. G. Nessler

[57] ABSTRACT

Disclosed are coatings which are improved by a special peening process. Uniform sized spherical steel shot, in the range 1–2.5 mm is impacted at uniform low velocities onto a coated workpiece. Peening intensities are in the range 0.30–0.60 mm N. MCrAlY high temperature coatings are particularly improved, with densities of the order of 99 percent. Physical vapor desposited coatings have surface finishes of the order of $30 \times 10^{-6}$ inch AA (Arithmetic Average) and plasma sprayed coatings have finishes of the order of $100 \times 10^{-6}$ inch AA compared to unpeened finishes of $50–60 \times 10^{-6}$ inch AA and $200–300 \times 10^{-6}$ AA respectively.

12 Claims, 11 Drawing Figures

PEENED OVERLAY COATINGS

TECHNICAL FIELD

The present invention relates to shot peen finishing of overlay coatings on metal workpieces, such as physical vapor deposited and plasma sprayed coatings.

BACKGROUND

Physical vapor deposition (PVD) is a process wherein metal and other materials are vaporized and caused to condense on a workpiece surface. The process is adapted for production and is currently used to deposit oxidation and corrosion resistant coatings, such as MCrAlY, on superalloy gas turbine airfoils which are used at high temperatures. The process produces an as-deposited coating which has a columnar grain structure, with the columns running perpendicular to the workpiece surface. The lack of continuity between the adjacent columns, and the presence of bigger vertical defects, called leaders, can affect the performance of the coatings. Therefore, it has been common practice to peen coatings and thereafter heat treat them. Typical coatings are of the order of 0.1 mm thick. Relatively low shot peening intensities are usually used. Various shot media can be used: glass beads are most common, with the choice being preferred nominally in the size GB20 (specification SAE-J1173 of the Society of Automotive Engineers), about 0.18–0.30 mm dia.

The peening is intended to mechanically close some of the defects. Further, compressive stresses are imparted to the coating, and in the subsequent heat treatment at high temperature, these are presumed to assist in recrystallization and consolidation of the coating grain boundaries. However, there are problems associated with peening according to the prior art. The inevitable presence of some fractured shot material especially in a mass of impinging glass beads means that fine jagged particles impact the coating. These tend to erode and remove portions of the coating. Additionally, airfoils have very thin trailing edges, as a characteristic feature. Unless these are physically masked, to prevent impingement of glass beads, the coating in these regions will often be chipped. The net result of this limitation is that the coating in the trailing edge region must be used with whatever defects are present in the as-deposited coating. The higher intensity attainable with GB20 glass beads is of the order of 0.45N (Almen strip number, "N" range, in mm, used throughout; see SAE J442). Higher intensities are attainable with material such as S110 steel shot (SAE J827) but damage by chipping of the coating may result.

Thus, within the constraints of avoiding erosion and avoiding chipping elsewhere, only a certain depth of compression and sealing is achieved. Metallographic studies show that in a typical peened 0.1–0.15 mm PVD coating there will still be defects in the half of the coating nearest the substrate surface. That is, the peening is very effective in the portion of the coating nearest the peened surface, but less effective at greater depths within the coating.

Plasma spray coating is another method which is used to physically deposit coatings on workpieces. In this process, molten droplets of metal are impelled toward the surface where they freeze and adhere. While significant improvements have been made in recent years, plasma coatings are still by nature somewhat porous. In contrast to the PVD coatings, the porosity in plasma coatings tends to be more randomly distributed; there is some tendency for the defects to run parallel with the workpiece surface. As in the case of PVD coatings, plasma coated gas turbine airfoils are glass bead peened and heat treated with results and problems similar to those mentioned above. However, plasma coatings further differ from PVD coatings, in that they have a relatively high characteristic roughness. A typical cast and uncoated airfoil for a gas turbine will have a surface finish of about 60 AA (Arithmetic Average expressed in units of $10^{-6}$ inch) with PVD coatings this finish is essentially replicated. But, in plasma coating the surface finish is inferior and of the order of 125–370 AA.

Therefore, in the peening and finishing coatings it is desirable that plasma coatings be given a smoother finish and that the finish of PVD coatings be at least sustained. Experience shows that glass bead peening of coatings does not substantially improve their surface finish. When better finish is sought, mechanical abrasion and other surface removal techniques have been used. These are costly and tend to undesirably remove some of the coating from the component.

SUMMARY OF THE INVENTION

An object of the invention is to improve the properties of overlay coatings on metal workpieces, by densifying and smoothing them.

According to the invention, when substantially uniform size spherical shot is impacted on the coating with substantially uniform velocity the surface finish of the coatings can be improved and the depth of defect healing increased. The surface finish obtained is sensitive to both the shot diameter and to the peening intensity.

An overlay coating, such as a plasma coating or physical vapor deposition (PVD) coating, is improved by peening the coating with substantially uniformed sized smooth spherical shot having a diameter in the range 1–2.5 mm. Preferably hardened steel shot in the 1.5–2 mm range is used. The shot, when impacted at a velocity sufficient to impart peening intensities in the range 0.30–0.60 mm N, leads to the closure of defects in a coating and improved surface finish. When subsequent heat treatment is used, the mechanically peened and closed defects are further healed by metallurgical diffusion. Thus, the density, protective properties, and surface finish, all are improved in a simple process.

When applied to 0.13 mm thick PVD coatings, such as MCrAlY oxidation and corrosion resisting coatings, the invention tends to heal defects to a greater depth than heretofore obtainable. Further, chipping and the like at thin edges is alleviated. A PVD coating on a workpiece can be produced having a surface finish of less than 40 AA, compared to prior art finishes of the order of 60 AA. Heat treatment at about 1040° C. is used for MCrAlY coatings.

MCrAlY plasma coatings are considerably rougher than PVD coatings when first deposited having finishes of the order of 300 AA. Peening and smoothing in accord with the invention results in the same beneficial healing experienced with PVD coatings and the surface finishes produced are of less than 100 AA, compared to prior art processes which produce finishes in the range of 100–150 AA.

Surface finish decreases as shot peening intensity increases. Small shot produces faster peening but produces less smooth finish than larger shot. Therefore, while larger shot size is preferred, to obtain efficient results, it must be substantially uniformly sized and impacted at substantially uniform velocity.

The invention provides coatings which are of the order of 99 percent dense, including coatings at thin edge locations. Further the coatings have surface finishes which are significantly smoother than before peening, or after peening in accord with the prior art.

The foregoing and other objects, features and advantages of the present invention will become more apparent from the following description of preferred embodiments and accompanying drawings.

BEST MODE FOR CARRYING OUT THE INVENTION

Other applications, with common inventorship and assignee herewith, have relation to the present invention. Ser. No. 300,725 "Method for Simultaneous Peening and Smoothing" discloses a process wherein hardened steel shot is impacted at uniform velocities on a workpiece; the method is used in the present invention. Ser. No. 300,726 "Shot Peening Apparatus" describes equipment which enables practice of the present invention. Ser. No. 300,718 "Method of Peening Airfoils and Thin Edged Workpieces" and Ser. No. 300,723 "Duplex Peening and Smoothing Process" describe techniques especially useful in obtaining smooth finishing on airfoil shapes. The disclosures of the foregoing are hereby incorporated by reference.

The preferred practice of the invention is described in terms of the finishing of MCrAlY coatings on nickel superalloy gas turbine blades. However, it will be evident that the invention will be pertinent to other kinds of coatings applied to other workpieces. Likewise, PVD and plasma spray coatings are given as examples. However, it will be evident that the invention will be applicable to other types of coatings which are deposited and have defects to be eliminated.

MCrAlY coatings are decribed in U.S. Pat. Nos. 3,542,530, 3,676,085, 3,918,139, 3,928,026 and elsewhere. The physical vapor deposition process is well known, and is described in U.S. Pat. Nos. 3,590,777, 3,628,994, 3,639,151, 3,667,421 and elsewhere. Plasma spraying is also a well known process. In the practice of the present invention, it is desirable to use the procedures described in U.S. Pat. Nos. 4,235,943 and 4,236,059, or other advanced techniques whereby the maximum density is obtained in an as-deposited coatings. The disclosures of all the foregoing patents are hereby incorporated by reference.

Figure 1:
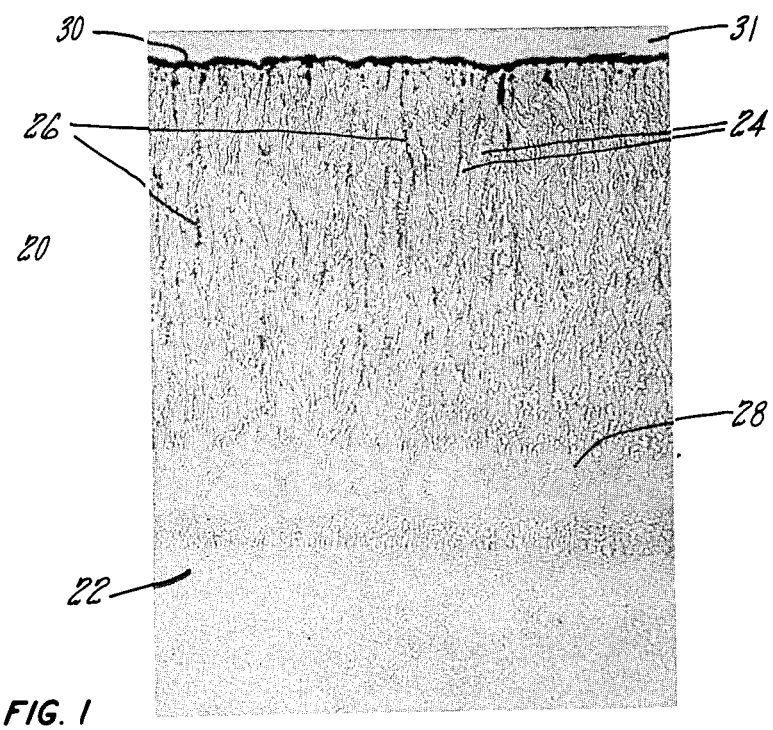
FIG. 1 is a photomicrograph of a 0.13 mm PVD MCrAlY coating on a substrate prior to peening.

In FIG. 1, an illustrative as-deposited PVD MCrAlY coating 20 is shown as it appears in metallographic cross section when deposited on a substrate 22 of nickel base superalloy MAR M-200+2% hafnium. (By weight percent, 9Cr-10Co-2Ti-5Al-0.11C-12.5W-1Cb-0.015B-2Hf-balance Ni.) The coating is comprised of a multiplicity of columnar grains 24, between which there are dark colored discontinuous defect regions 26. These defects are generally characterized as leaders, and in many instances they extend from the coating-substrate interface 28 to the surface 30 of the coating. (Above the surface is protective metallographic mounting material, nickel plate, 31.) The coating has nominally the same surface finish as the substrate, but in many instances imperfect deposition will produce an inferior finish.

After a coating like that in FIG. 1 is deposited, the surface 30 is shot peened generally according to the method of above-mentioned application Ser. No. 300,725 "Method for Simultaneous Peening and Smoothing" using 1.8 mm diameter hardened spherical steel shot. The diameter of the shot used to effect the peening should be uniform for best results. In the practice of the invention, the shot velocity will be uniform within ±4%, and will lie in the range 4.7–6.3 m/sec. according to the shot peening intensity, I, desired. For the PVD coating described, the resultant I will be in the range of about 0.47±0.5 mm N, at saturation according to practices in SAE specifications J442 and AMS2430. The peening is best produced using 1.8 mm steel shot by allowing it to fall freely under the influence of gravity from a height of 1.5–1.9 m, from whence it will have a velocity of about 5.5–6 m/sec. and each shot particle will have an energy of about $4 \times 10^{-4}$J at impact.

Figure 2:
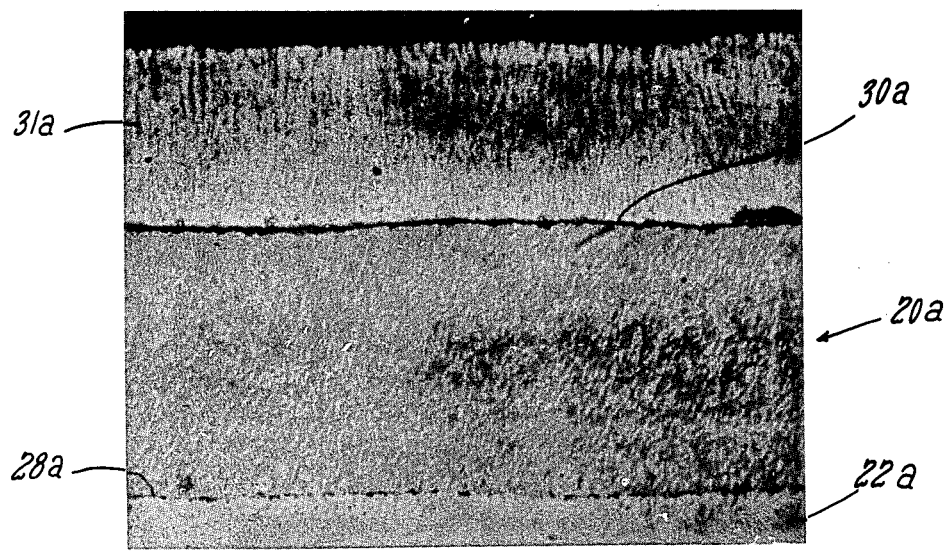
FIG. 2 is a photomicrograph of a PVD MCrAlY coating after peening and heat treatment in accord with the invention.

An object of using the relatively large shot is to impart plastic deformation to a depth greater than heretofore attainable. The peening does this and has other desirable effects. First, the plastic deformation results in mechanical closure of some of the discontinuous regions in the coating. Secondly, the coating is left with residual elastic mechanical stresses. Thirdly, the surface 30 is smoothed. After peening, the coating is heat treated at a temperature of 1040°±14° C. in an inert atmosphere, such as a vacuum. A coating so produced is shown in FIG. 2. It is seen that virtually all the leaders have been sealed. The density is almost 100% of the solid metal value. In addition, it is seen that the surface 30a of the workpiece is quite smooth. Measurement shows that the surface finish is of the order of 25–35 AA, compared to the 50–60 AA of the coating before peening. (AA means Arithmetic Average of surface roughness as measured with a profilometer in accord with ANSI B46-1; in $10^{-6}$ inch.)

Figure 3:
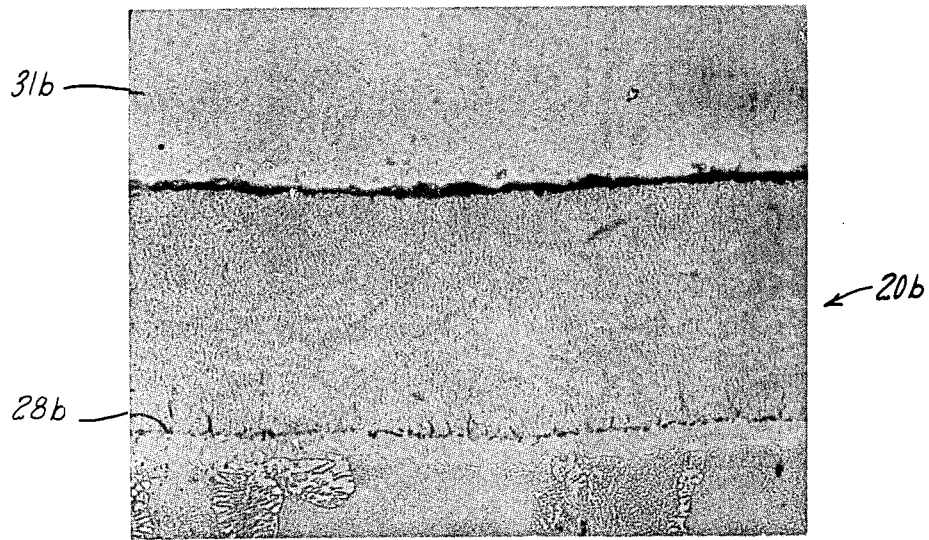
FIG. 3 is a photomicrograph of a PVD MCrAlY coating peened in accord with the prior art.
Figure 4:
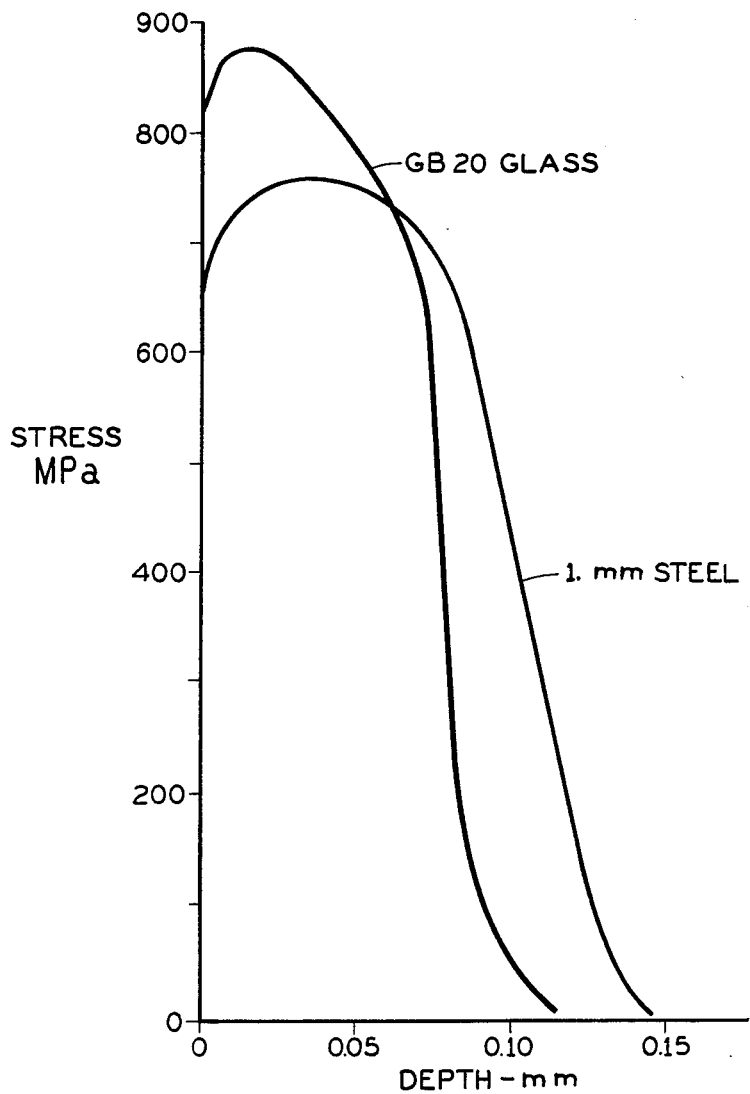
FIG. 4 graphically shows the residual stresses in a workpiece after peening.

FIG. 3 shows a MCrAlY coating, identical to that just described, prepared according to the techniques of the prior art. The FIG. 3 coating was peened with glass beads of SAE J1173 designation GB20, about 0.2 to 0.3 mm diameter, using conventional air propulsion of the shot. The peening intensity was about 0.47N; after peening the coating was heat treated as described above for the FIG. 2 specimen. It is seen from FIG. 3 that the coating defects have been closed to a lesser depth than that which resulted from the inventive method. The surface finish of the coating has been improved somewhat to 40–50 AA, using virgin glass beads free of fragments. The improved densification using the invention practices is understandable from test measurements made of titanium alloy (Ti-6Al-4V) test specimens which had been peened to the same intensity but using different shot diameters. FIG. 4 compares the residual compressive stress as measured by x-ray diffraction at different points beneath the surface of specimens peened to an I of 0.27N using GB20 and 1.6 mm dia steel shot. It is seen that the residual stress state for the larger steel shot is deeper, and the average stress is lower. This shows the superiority of the larger steel shot and explains why the superior densification in FIG. 2 is obtained.

Figure 5:
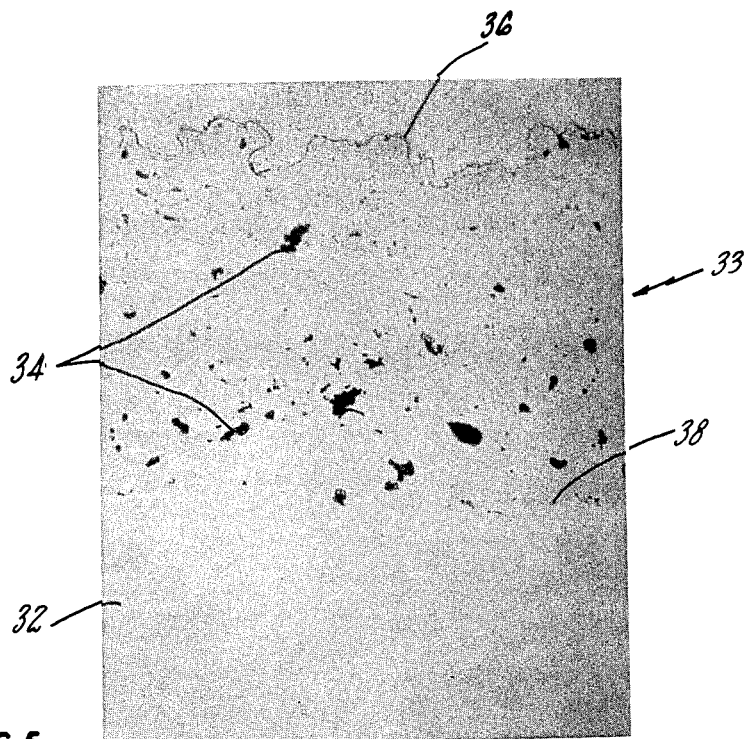
FIG. 5 is a photomicrograph of a 0.13 mm plasma sprayed MCrAlY coating on a workpiece.
Figure 6:
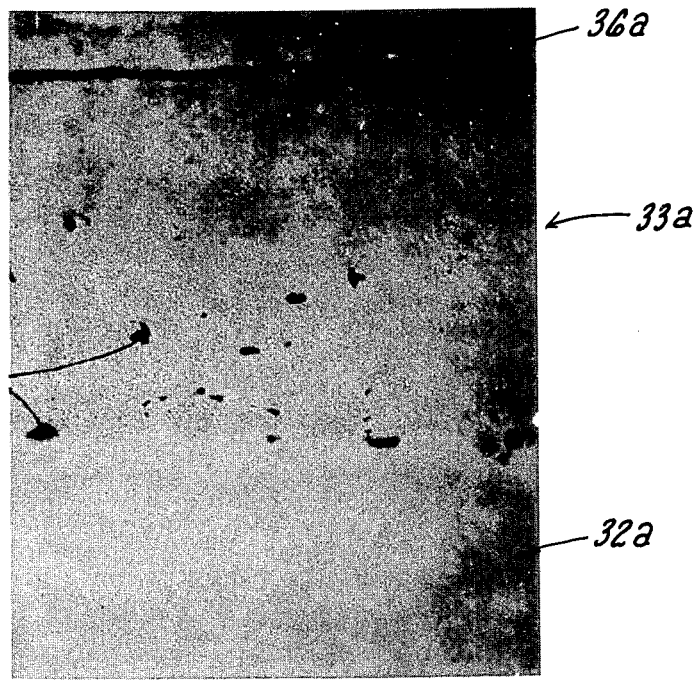
FIG. 6 shows the coating of FIG. 5 after peening and smoothing in accord with the invention.
Figure 7:
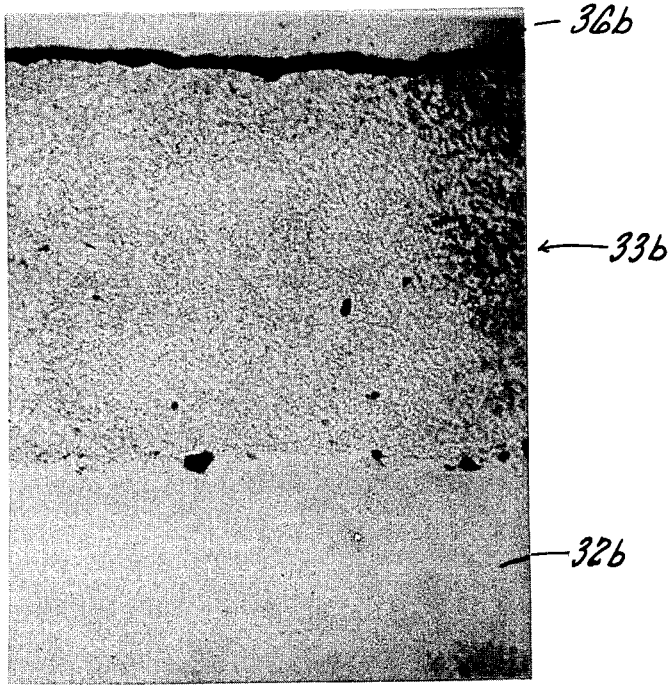
FIG. 7 shows the coating of FIG. 6 after heat treatment.

The practice of the invention with plasma coatings is illustrated by FIGS. 5-7. FIG. 5 shows an as-deposited MCrAlY coating 33 on a MAR M-200+Hf superalloy substrate 32. Characteristic void defects 34 are more or less uniformly dispersed through the coating, ranging from the surface 36 to the substrate and coating interface 38. Measurement shows the density of the coating is about 6.77 gm/cc, or about 94% of the theoretical density of the solid constituent metals. The finish of the coating is of the order of 250–370 AA.

FIG. 6 shows the coating after it has been peened using the 1.8 mm steel shot at an I of 0.45–0.49N. It is seen that there has been mechanical closure of many of the defects and the surface 36a of the coating has been significantly smoothed, to a finish of about 60–80 AA.

FIG. 7 shows the coating after heat treatment at 1065°–1093° C. for 4 hours. During the heat treating process, the coating has been somewhat further denisified, and there has been diffusion and netallurgical consolidation at the former defect regions. Measurements show a density of about 7.14 gm/cc, or 99% of theoretical. The desirable improved surface finish produced by peening has been preserved. The denser coating has superior mechanical properties and functional performance, as is well known. The smoother surface finish provides an aerodynamically superior gas turbine airfoil, and offers improvements in other applications.

By contrast, a coating peened using GB20 to the same intensity would result in a less effective densification, as described for the PVD coating, and an inferior surface finish of about 100–150 AA.

In applying the invention to MCrAlY coatings on nickel alloy turbine airfoils, it is found that chipping at the trailing edge is no longer the problem it is in glass bead peening. As disclosed in our related application Ser. No. 300,718 "Method for Peening Airfoils", relatively fragile titanium alloy compressor blades suffer peening damage unless they are only oscillated about their long axes, and not rotated, in the shot stream. Impacts directly on the edges must be avoided.

Turbine airfoils are made of stronger nickel alloys and tend to have heavier edges. Also, the presence of the coating on the piece tends to increase the effective edge thickness. Despite these factors, chipping of coatings has been a problem when using glass bead peening. Mechanical masks have been used to protect the edges. When the uniform steel shot of the present invention was applied to the peening of coatings, it was unexpectedly found that chipping was not a problem, even when the shot was impacted directly on the airfoil edge, as when the airfoil is rotated in the shot stream.

Figure 8:
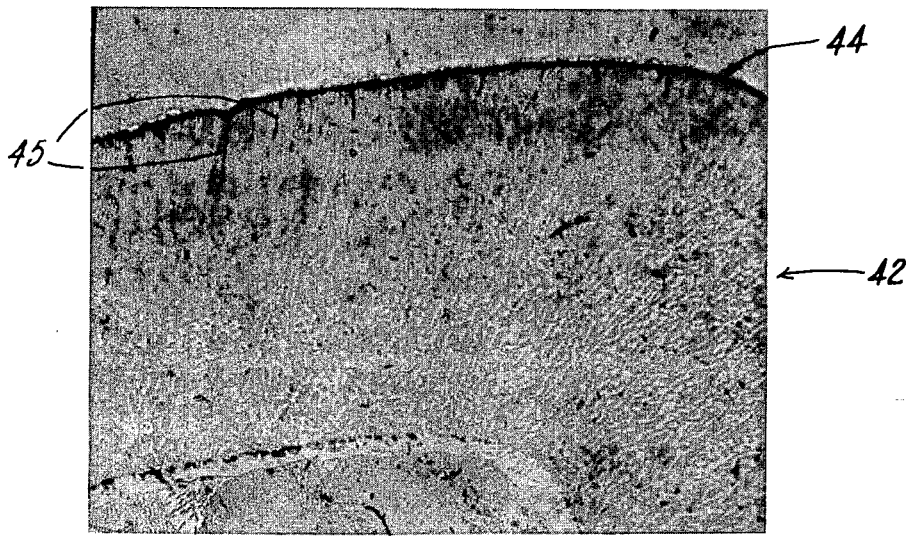
FIG. 8 in micrographic cross section a 0.13 mm MCrAlY coating on the trailing edge of a superalloy airfoil, peened in accord with the prior art.

Initially, we used the oscillation techniques, and these are suitable in certain instances. However, we soon discovered that chipping was not a problem, and even when the airfoil was rotated in the shot stream, despite the direct impacts on the edge. Why this is so is not fully understood at the present time. The phenomenon lends the invention substantial merit; since uniform stressing can be obtained all over the airfoil, including the trailing edge, improved components result. By way of example, FIG. 8 shows in cross section a portion 40 of the trailing edge of a turbine blade. Overlaid thereon is a PVD MCrAlY coating 42 which has been glass bead peening according to the prior art. Inasmuch as mechanical masking was used at the trailing edge, and there was no peening, it is seen that there are defects 45 at the edge 44 of the coating. If masking had not been used, the coating would have been missing, due to chipping.

Figure 9:
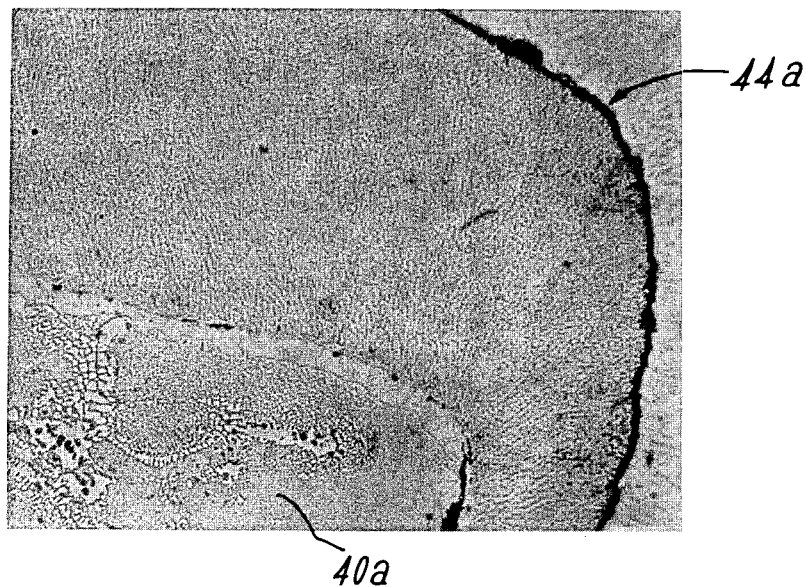
FIG. 9 is analogous to FIG. 8, but using the techniques of the invention.

In contrast, FIG. 9 shows the analogous trailing edge part 40a of another coated airfoil which was processed using the techniques of the invention described for the PVD coating above. It is seen that the number of defects in the region 44a is substantially less than was heretofore possible.

Figure 10:
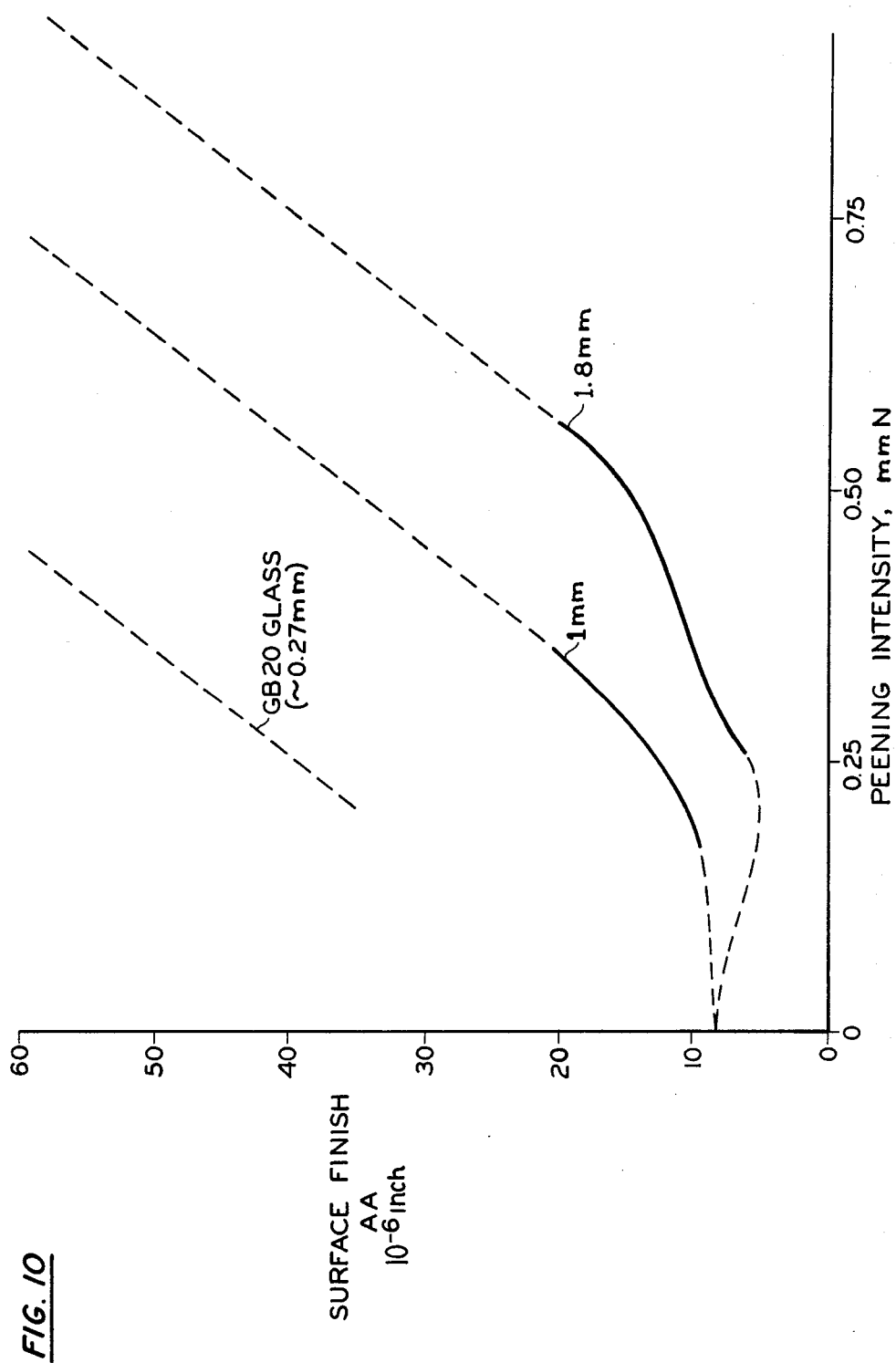
FIG. 10 shows the interrelation between surface finish and peening intensity using different shot sizes.

FIG. 10 shows the general correlation with surface finish and intensity, I, which is obtained when finishing titanium alloy surfaces. It is adapted from a Figure in the referenced application Ser. No. 300,725 "Method for Simultaneous Peening and Smoothing". As can be seen the larger shot provides a better finish, and as I is increased for a certain size shot, the finish decreases. Therefore, these relations indicate the preferable use of the larger shot. Accordingly, the shot size should be of a diameter of 1 mm or greater, preferably between 1–2.5 mm, and more preferably between 1.5–2 mm. As indicated in the copending applications, for any particular nominal diameter, the shot should be uniform within ±0.05 mm. The 1 mm and 2.5 mm shot we used to produce the data presented herein was about half the foregoing tolerance, while the larger 1.8 mm shot was at the tolerance. Ready calculation shows that the foregoing size tolerances are reflected in mass variations of 6–18 percent, depending on the shot size. In gravity accelerated peening uniform velocities of within about 3–4 percent are attained, and these are consistent with the mass tolerances, since the impact energy is dependent on both the square of the velocity and the mass. When the mass and velocity squared parameters are treated statistically, it is seen that the shot in our invention will have energies within about 25 percent of a mean. Considering the variations in the prior art shot and in the velocities provided by the normal means of shot acceleration, the foregoing tolerance will be appreciated as uniform, by comparison.

Such uniformity in shot peening energies allows the imparting of the maxmimum peening intensity to the workpiece, and the simultaneous attainment of good finishes, in an economic time. If there were deviant high energy particles, then wherever they impacted finish would be worsened; if there were deviant low energy particles, the requisite compressive stresses would not be achieved, except over a longer period of time.

Figure 11:
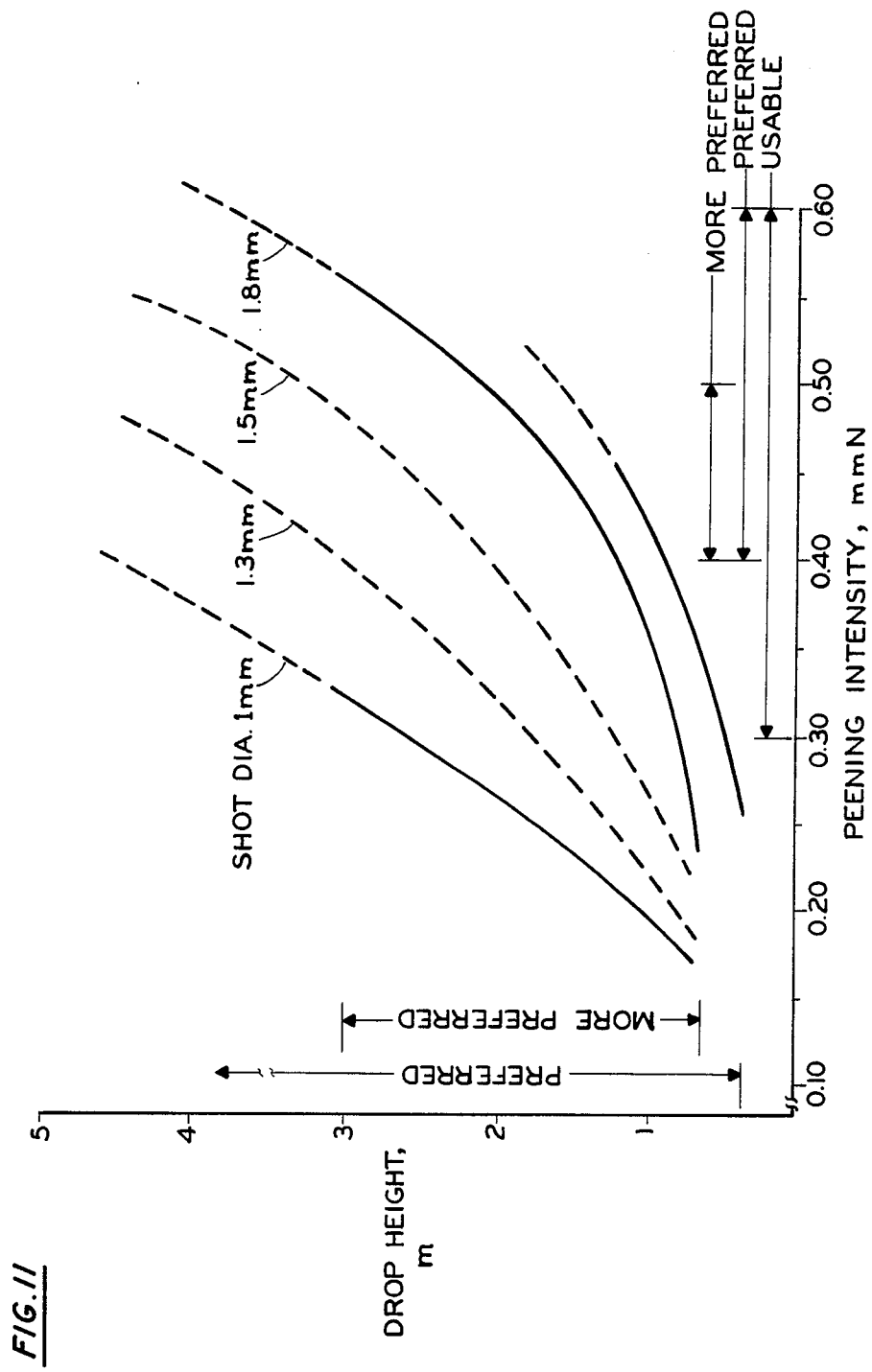
FIG. 11 shows the general and preferred interrelations between shot size, gravity drop height, and intensity.

FIG. 11 indicates the relationship between I and height in gravity accelerated peening. To obtain proper closure of coating defects, as the examples above indicate, it is necessary to exceed certain intensities. The intensity of peening necessary to seal a coating is dependent on the thickness of the coating. For the characteristic 0.13 mm thick coating used on gas turbine airfoil, the intensity will preferably be greater than 0.4N, although an I of as low as 0.3N may be found usable. The upper limit of I is determined by chipping and physical degradation of the coating, as well as the inferior surface finish which results, after FIG. 10. Consequently, I of less than 0.5N is more preferred, but I of up to 0.6N will be useful. For these I ranges, it is seen from FIG. 10 that the preferred shot size is 1 mm or greater. Also, larger shot sizes are preferred because according to FIG. 11, they require lower velocities and lower drop heights. At excessively high drop heights, impractical equipment requirements result. However, when shot size is too large, the drop heights for I less than 0.6N becomes rather small. Therefore small errors in height (or changes in shape of workpiece) can result in different impact velocities at the workpiece surface, producing I's outside the desired range. Also, larger shot sizes require longer times to obtain saturation, and they are not adapted to effectively peen small radius fillets and the like.

In summary, smaller shot is desired because it produces faster results. But, larger shot is preferred because it produces better finish or requires lower shot peening intensity for the same effect on the coating, and at any intensity produces a deeper stress effect.

For gravity accelerated peening, the preferred drop heights are greater than 0.3 m, less than 6 m and preferably between 0.5 and 2.0 m. It is seen from FIG. 11 that the drop height will affect the shot peening intensity. For example, 1.8 mm shot at 2 m drop will yield a change in I of about 0.08N for a 0.1 m change in height. From the set forth drop heights, the velocity of the shot particles may be determined. These velocities may be replicated if other shot accelerating techniques are used.

While the invention has been described in terms of MCrAlY coatings, it will be applicable to other coatings, most certainly to those which have similar physical properties to MCrAlY at room temperatures. Although ductile at elevated temperatures, MCrAlY coatings are relatively brittle at room temperature. Thus, the beneficial results with these coatings indicate the invention will be useful with other like coatings, as well as to more ductile coatings applied by a variety of processes including plating, fusion, cementation and so forth. In addition, limited experiment indicates that the invention may be utilized with coatings having organic vehicle binders. Of course, if only physical densification and smoothing, without metallurgical consolidation of the former defects is sought, then the heat treating step may be omitted.

Although this invention has been shown and described with respect to a preferred embodiment, it will be understood by those skilled in the art that various changes in form and detail thereof may be made without departing from the spirit and scope of the claimed invention.

We claim:

1. An article having an overlay coating with a surface finish smoother than about $50 \times 10^{-6}$ inch Arithmetic Average produced by a process which comprises first applying a coating to a workpiece, and then peening the coating surface with spherical shot having a diameter uniform to $\pm 4\%$ and a velocity uniform to $\pm 4\%$, the diameter of the shot lying in the range 1-2.5 mm.

2. The article of claim 1, wherein the coating is heat treated after peening to cause consolidation and sealing of deflects in the coating.

3. The article of claim 1 wherein the article is made of superalloy and has a high temperature oxidation and corrosion resisting coating of MCrAlY, where M is a metal selected from the group consisting of Fe, Co, Ni, and mixtures thereof.

4. The article of claim 3 wherein the coating is MCrAlY deposited by physical vapor deposition, and after shot peening has a surface finish smoother than about $40 \times 10^{-6}$ inch Arithmetic Average, and a density of at least about 99 percent of theoretical.

5. The article of claim 4 wherein the coating is heat treated after peening at 1040° C. or greater.

6. An article having an overlay plasma coating with a surface finish smoother than about $100 \times 10^{-6}$ inch Arithmetic Average produced by a process which comprises first spraying a plasma coating on the workpiece, and then peening the coating surface with spherical shot having diameter uniform to $\pm 4\%$ and velocity uniform to $\pm 4\%$, the diameter of the shot lying in the range 1.5-2 mm.

7. The article of claim 1 or 6 wherein the shot diameter is in the range 1.5-2 mm.

8. The article of claim 1 or 6 wherein the peening intensity is in the range of about 0.3-0.6 mm N.

9. The article of claim 6 wherein the coating is heat treated after peening to cause consolidation and sealing of defects in the coating.

10. The article of claim 6 wherein the coating is comprised of MCrAlY and after shot peening has a density of at least about 98 percent of theoretical.

11. In the method of applying an overlay coating to an article wherein the coating is shot peened and heat treated, the improvement which comprises peening the coating before heat treatment with shot which has a diameter uniform to $\pm 4\%$ in the range 1-2.5 mm, a velocity substantially uniform to $\pm 4\%$, and an energy level substantially uniform to $\pm 25\%$ to provide an intensity of 0.3-0.6 mm N and to thereby densify the coating and to provide it with a finish of less than $100 \times 10^{-6}$ inch Arithmetic Average.

12. The method of claim 11 wherein the coating is of the MCrAlY type and the heat treatment is at about 1040° C.

* * * * *